(12) United States Patent
Zhu et al.

(10) Patent No.: US 9,542,990 B2
(45) Date of Patent: Jan. 10, 2017

(54) SEMICONDUCTOR MEMORY DEVICE AND METHOD FOR ACCESSING THE SAME

(75) Inventors: Zhengyong Zhu, Beijing (CN); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 811 days.

(21) Appl. No.: 13/508,204

(22) PCT Filed: Feb. 28, 2012

(86) PCT No.: PCT/CN2012/071713
§ 371 (c)(1),
(2), (4) Date: May 4, 2012

(87) PCT Pub. No.: WO2013/120285
PCT Pub. Date: Aug. 22, 2013

(65) Prior Publication Data
US 2013/0208551 A1    Aug. 15, 2013

(30) Foreign Application Priority Data

Feb. 13, 2012 (CN) .......................... 2012 1 0031886

(51) Int. Cl.
*G11C 13/02* (2006.01)
*G11C 11/403* (2006.01)
(Continued)

(52) U.S. Cl.
CPC ......... *G11C 11/403* (2013.01); *G11C 13/0007* (2013.01); *H01L 27/108* (2013.01)

(58) Field of Classification Search
CPC .............................................. G11C 13/0007
(Continued)

(56) References Cited

U.S. PATENT DOCUMENTS 3,792,451 A * 2/1974 Almasi et al. ...................... 365/8
2003/0020103 A1 * 1/2003 Callaway et al. ............ 257/280
(Continued)

FOREIGN PATENT DOCUMENTS

CN    2547008 Y    4/2003
CN    1735972 A    2/2006
(Continued)

OTHER PUBLICATIONS

Bell et al., "Dominant Mobility Modulation by the Electric Field Effect at the LaAlO3/SrTiO3 Interface", Nov. 27, 2009, The American Physical Society-Physical Review Letters, pp. 226802-1 to 226802-4.*
Caviglia et al., "Electric field control of the LaAlO3/SrTiO3 interface ground state", Dec. 4, 2008, Macmillan Publishers Limited, Nature vol. 456, pp. 624-627.*
(Continued)

*Primary Examiner* — Hoai V Ho
*Assistant Examiner* — Jay Radke
(74) *Attorney, Agent, or Firm* — Osha Liang LLP

(57) ABSTRACT

A semiconductor memory device and a method for accessing the same are disclosed. The semiconductor memory device includes an oxide heterojunction transistor which includes: an oxide substrate; an oxide film on the oxide substrate, wherein an interfacial layer between the oxide substrate and the oxide film behaves like two-dimensional electron gas; a source electrode and a drain electrode being located on the oxide film and electrically connected with the interfacial layer; a front gate on the oxide film; and a back gate on a lower surface of the oxide substrate, wherein the source electrode and the drain electrode of the oxide heterojunction transistor are respectively connected with a first word line and a first bit line for reading operation, and wherein the front gate and the back gate are respectively connected with a second word line and a second bit line for writing operation.

20 Claims, 2 Drawing Sheets

(51) Int. Cl.
*G11C 13/00* (2006.01)
*H01L 27/108* (2006.01)

(58) Field of Classification Search
USPC .................................................. 365/148, 151
See application file for complete search history.

(56) References Cited

U.S. PATENT DOCUMENTS

| | | | |
|---|---|---|---|
| 2004/0108537 | A1 | 6/2004 | Tiwari |
| 2005/0143263 | A1* | 6/2005 | Face ............................ 505/210 |
| 2005/0224878 | A1 | 10/2005 | Chang |
| 2008/0048292 | A1* | 2/2008 | Baniecki et al. ............. 257/532 |
| 2008/0164455 | A1* | 7/2008 | Alvarado et al. ................. 257/4 |
| 2009/0010056 | A1 | 1/2009 | Kuo et al. |
| 2009/0103367 | A1 | 4/2009 | Lue |
| 2010/0080068 | A1* | 4/2010 | Bimberg et al. ......... 365/185.28 |
| 2010/0117062 | A1 | 5/2010 | Hudait et al. |
| 2010/0285616 | A1 | 11/2010 | Cho et al. |
| 2013/0079230 | A1* | 3/2013 | Poppe ................... H01L 39/145 505/190 |

FOREIGN PATENT DOCUMENTS

| | | |
|---|---|---|
| CN | 1938836 A | 3/2007 |
| CN | 101414479 A | 4/2009 |
| CN | 102150367 A | 8/2011 |

OTHER PUBLICATIONS

Hirakawa et al., "Mobility Modulation of the Two-Dimensional Electron Gas Via Controlled Deformation of the Electron Wave Function in Selectively Doped AlGaAs-GaAs Heterojunctions", Mar. 25, 1985, The American Physical Society-Physical Review Lettes, pp. 1279-1282.*
Mannhart et al., "Two-Dimensional Electron Gases at Oxide Interfaces", Nov. 2008, MRS Bulletin, vol. 33, pp. 1027-1034.*
S. Thiel, "Tunable Quasi-Two-Dimensional Electron Gases in Oxide Heterostructures", Science vol. 313, pp. 1942-1945, Sep. 29, 2006.*
Hwang et al., "Emergent phenomena at oxide interfaces", Jan. 2012, Nature Materials, vol. 11, pp. 103-113.*
PCT International Search Report and Written Opinion dated Feb. 13, 2012, from related International Patent Application No. PCT/CN2012/071713 (9 pages).
Office Action issued in corresponding Chinese Application No. 201210031886.7 dated Oct. 14, 2015 (7 pages).
"Tunable quasi-two-dimensional electron gases in oxide heterostructures", S. Thiel, Sep. 29, 2006 vol. 313 www.sciencemag.org (5 pages).
First Office Action mailed Feb. 16, 2015, by the State Intellectual Property Office of the People's Republic of China in corresponding Chinese Patent Application No. CN-2012100318867, with English translation (10 pages).

* cited by examiner

SEMICONDUCTOR MEMORY DEVICE AND METHOD FOR ACCESSING THE SAME

CROSS-REFERENCE TO RELATED APPLICATIONS

This application is a national stage application based on PCT/CN2012/071713, filed on Feb. 28, 2012, entitled "Semiconductor Memory Device and Method for Accessing the Same," which claims priority to China Patent Application No. CN 201210031886.7, filed on Feb. 13, 2012. Both the PCT Application and Chinese Application are incorporated herein by reference in their entireties.

TECHNICAL FIELD

The present disclosure relates to a semiconductor memory device and a method for accessing the same, and in particular, to a semiconductor memory device using a heterojunction transistor and a method for accessing the same.

BACKGROUND

In a memory cell having a two transistors/one capacitor (2T/1C) configuration, the capacitor C stores charges representative of logic "1" or logic "0", and the first control transistor Q1 and the second control transistor Q2 perform reading operation and writing operation, respectively.

Because 2T/1C memory device stores data in the capacitor, it should be refreshed at a time interval and can only be used as a dynamic random access memory (DRAM). A refresh period of the 2T/1C memory cell should be smaller than a retention time of the capacitor. Due to periodical refresh of the 2T/1C memory cell, the memory has a complex controller circuit and has a large power dissipation.

In the 2T/1C memory cell, it is necessary for the capacitor to have large capacitance so as to provide a retention time as long as possible, which, however, increases occupied area of the memory cell and decreases integration level of the memory.

Thus, it is still desirable to develop a memory cell without a capacitor.

SUMMARY OF THE DISCLOSURE

The object of the present disclosure is to provide a semiconductor memory having a high integration level and reduced refresh operations.

According to one aspect of the present disclosure, there is provided a semiconductor memory device, comprising an oxide heterojunction transistor which comprises: an oxide substrate; an oxide film on the oxide substrate, wherein an interfacial layer between the oxide substrate and the oxide film behaves like two-dimensional electron gas; a source electrode and a drain electrode being located on the oxide film and electrically connected with the interfacial layer; a front gate on the oxide film; and a back gate on a lower surface of the oxide substrate, wherein the source electrode and the drain electrode of the oxide heterojunction transistor are respectively connected with a first word line and a first bit line for reading operation, and wherein the front gate and the back gate are respectively connected with a second word line and a second bit line for writing operation.

According to another aspect of the present disclosure, there is provided a semiconductor memory device, comprising an oxide heterojunction transistor which comprises: a semiconductor substrate; a back gate being buried in the semiconductor substrate; an oxide base layer on the back gate; an oxide film on the oxide base layer, wherein an interfacial layer between the oxide base layer and the oxide film behaves like two-dimensional electron gas; a source electrode and a drain electrode being located on the oxide film and electrically connected with the interfacial layer; and a front gate on the oxide film, wherein the source electrode and the drain electrode of the oxide heterojunction transistor are respectively connected with a first word line and a first bit line for reading operation, and wherein the front gate and the back gate are respectively connected with a second word line and a second bit line for writing operation.

According to another aspect of the present disclosure, there is provided a method for accessing the above semiconductor memory devices, comprising: in reading operation, a constant current is applied to the source electrode and the drain electrode through the first word line and the first bit line, and a voltage across the source electrode and the drain electrode is measured to indicate a resistance state of the interfacial layer; and in writing operation, while the first word line and the first bit line are floated, a bias voltage is applied across the front gate and the back gate through the second word line and the second bit line to manipulate the resistance state of the interfacial layer.

The inventive semiconductor memory device has a 1T (one transistor) configuration, in which the oxide heterojunction transistor functions both as a storage element and as a control element. Thus, the semiconductor memory device does not need a capacitor in addition to the transistor.

Compared with a semiconductor memory device having a capacitor, the inventive semiconductor memory device has a substantially reduced footprint. Integration level of memory cells is increased accordingly. A memory effect of the oxide heterojunction transistor is utilized to store data in a long period, which decreases refresh frequency. In a case that a retention period of the oxide heterojunction transistor is larger than its work time, no refresh operation is performed. The inventive semiconductor memory device with 1T configuration can decrease power dissipation remarkably, and simplifies a controller circuit of the semiconductor memory device.

Moreover, the inventive semiconductor memory device can be manufactured with a process completely compatible with current semiconductor processes. For example, the manufacturing process includes epitaxially growing thin films (for example, by PLD, MBE, ALD, CVD, sputtering, and the like), patterning (for example, by lithography, electron beam exposure, and the like), etching (for example, by dry etching using plasma, wet etching using etchant solution, and the like), depositing and peeling off metal layers, planarization (for example, by SOG, CMP, and the like), ion implantation, thermal anneal, and the like. Thus, the semiconductor memory device according to the present disclosure can be manufactured with low cost.

DETAILED DESCRIPTION

The present disclosure will be described below with those preferred embodiments in connection with attached drawings. However, it should be understood that the descriptions here are only illustrative, without intention of limiting a protection scope. Also, the following description omits details of those known structure and techniques so that concepts of the disclosure are not obscured unnecessarily.

Figure 1:
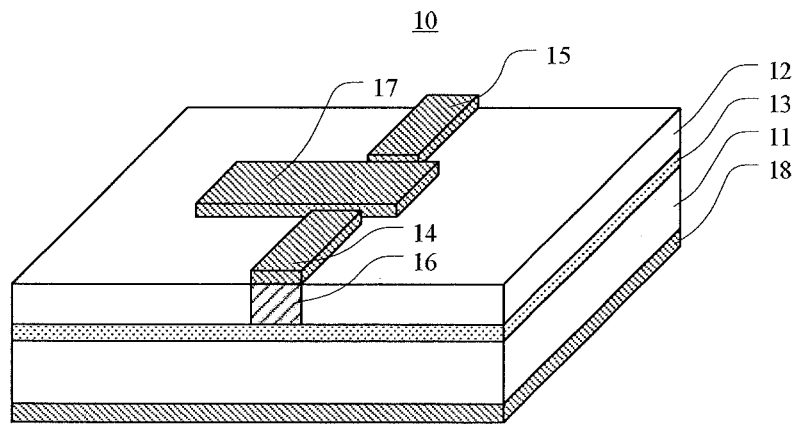
FIG. 1 is a schematic diagram illustrating a structure of an oxide heterojunction transistor according to an embodiment of the present disclosure.

A structure of an oxide heterojunction transistor 10 is illustrated in FIG. 1. The oxide heterojunction transistor 10 comprises an oxide substrate 11, such as a strontium titanate substrate, and an oxide film 12, such as a lanthanum aluminate film, on the oxide substrate 11. The oxide film 12 may be an oxide film epitaxially grown on the oxide substrate 11. The oxide substrate 11 and the oxide film 12 constitute a heterojunction. Although an interface between the oxide substrate 11 and the oxide film 12, i.e. an interface of the heterojunction is not a separate layer, it is shown as an interfacial layer 13 alone in FIG. 1 for the convenience of explanation for the oxide heterojunction transistor 10. The interfacial layer 13 behaves like two dimensional electron gas. The interfacial layer 13 serves as a channel of the oxide heterojunction transistor 10.

A source electrode 14 and a drain electrode 15 are formed above the oxide film 12, and electrically connected with the interfacial layer 13 through respective conductive vias 16. A front gate 17 is formed above the oxide film 12 and applies an electrical field to the interfacial layer 13 across the oxide film 12 during operation. A back gate 18 is formed on a lower surface of the oxide substrate 11 and applies an electrical field to the interfacial layer 13 across the oxide substrate 11 during operation. In view of the fact that the oxide substrate 11 serves as gate dielectric of the back gate, it should have a small thickness, for example, less than 1 micrometer. The oxide substrate 11 may be thinned by ion milling.

The source electrode 14, the drain electrode 15 and the front gate 17 may be formed from the same one conductive layer on the oxide film 12 by patterning the conductive layer. The conductive layer may be made of a metal, such as Au, Ag, Cu, Al, Ti, Cu, Ni, Cr or Pt, an oxide, such as indium tin oxide, zinc aluminum oxide, zinc tin oxide or strontium ruthenate, heavily-doped polysilicon or heavily-doped strontium titanate. The back gate 18 may be a conductive layer on a lower surface of the oxide substrate 1. The conductive layer may be made of a metal, such as Au, Ag, Cu, Al, Ti, Cu, Ni, Cr or Pt, an oxide, such as indium tin oxide, zinc aluminum oxide, zinc tin oxide or strontium ruthenate, heavily-doped polysilicon or heavily-doped strontium titanate. The oxide heterojunction transistor 10 has four terminals (not shown) for the source electrode 14, the drain electrode 15, the front gate 17 and the back gate 18 respectively, for providing electrical connection with external circuits.

As an example, the oxide heterojunction transistor 10 may be formed in the steps as described below.

An oxide film 12, for example, a lanthanum aluminate film, is epitaxially grown on an oxide substrate 11, for example, a strontium titanate substrate, by pulsed laser deposition (PLD), molecular beam epitaxy (MBE), chemical vapor deposition (CVD) and the like. The oxide film 12 has a thickness of about 3 unit cells.

Next, the oxide film 12 is patterned to provide via holes up to an interfacial layer 13. Conductive vias 16 are then formed by filling up the via holes with a conductive material such as a metal.

The following steps may be involved in the patterning process: a photoresist mask having a pattern therein is formed on the oxide film 12, by a conventional lithographical process including exposure and development steps; the exposed portions of the oxide film 12 are removed to form via holes by dry etching such as ion beam milling, plasma etching, reactive ion etching, laser ablation and the like, or by wet etching which uses an etching solution.

Further, the via holes are filled up by depositing the conductive material. The conductive vias 16 are formed by peeling off the conductive material outside of the via holes. The surface of the semiconductor structure may be planarized by chemical mechanical polishing (CMP), if needed.

Next, a source electrode 14, a drain electrode 15 and a front gate 17 are formed by depositing a conductive layer on the oxide film 12 by a conventional deposition process and then patterning the conductive layer. The source electrode 14 and the drain electrode 15 are aligned with the respective ones of the conductive vias.

Next, a back gate 18 is formed by depositing a conductive layer on a lower surface of the oxide substrate 11 by a conventional deposition process. The back gate 18 can also be a patterned conductive layer if needed.

Preferably, a suitable insulator layer (not shown) may be grown on the oxide film 12 by atomic layer deposition or other epitaxial growth processes in a case that the insulator layer does not adversely affect memory effect of the oxide heterojunction transistor. The insulator layer is used as a protection layer for the oxide film 12 and the interfacial layer 13.

In the above embodiment, the oxide heterojunction transistor 10 comprises the oxide substrate 11 and the oxide film 12. In an alternative embodiment, the oxide heterojunction transistor 10 may comprise an oxide base layer (for example, a strontium titanate layer, not shown) formed on a semiconductor layer (for example, silicon, not shown) and an oxide film formed on the oxide base layer. The semiconductor substrate may be doped to be conductive and provide a buried back gate 18 with the oxide base layer serving as back gate dielectric.

The oxide substrate 11, the oxide base layer and/or the oxide film 12 may be made of at least one selected from a group consisting of lanthanum aluminate, strontium titanate, potassium tantalate, lithium tantalate, lithium niobate, lead titanate, lead zirconate, barium tatanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, zirconium oxide. For example, the oxide substrate 11, the oxide base layer and/or the oxide film 12 each may be any combinations of the above materials, such as a stack.

The oxide substrate 11, the oxide base layer and/or the oxide film 12 may be doped or undoped. The oxide substrate 11 may be a single-crystal substrate. The oxide base layer and/or the oxide film 12 may be grown epitaxially.

Preferably, the back gate 18 may be electrically connected with wirings on the oxide film 12 by means additional conductive vias (not shown) to provide simple configuration of the oxide heterojunction transistor.

Figure 2:
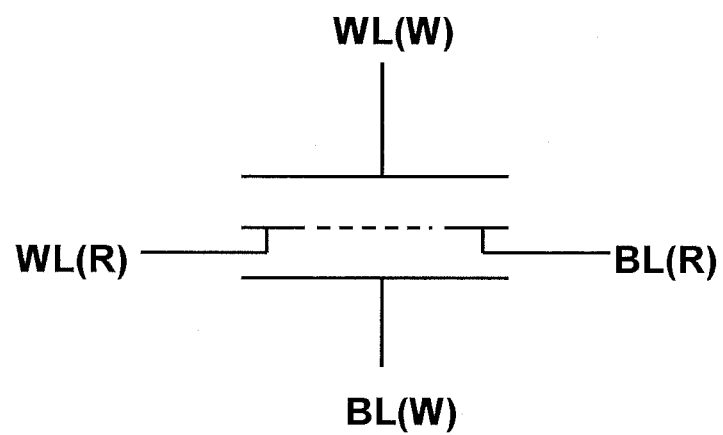
FIG. 2 is an equivalent circuit of a semiconductor memory device according to an embodiment of the present disclosure, which uses the oxide heterojunction transistor as shown in FIG. 1.

Preferably, the conductive vias 16 of the source electrode 14 and the drain electrode 15 may extend below the front gate 17 to form source/drain extensions for enhancing control of the channel region by the front gate 17. FIG. 2 is an equivalent circuit of a semiconductor memory device according to an embodiment of the present disclosure, which uses the oxide heterojunction transistor 10 as shown in FIG. 1. The source electrode 14 and the drain electrode 15 of the oxide heterojunction transistor 10 are connected with the first word line WL(R) and the first bit line BL(R) for reading operation, respectively. The front gate 17 and the back gate 18 are connected with the second word line WL(W) and the second bit line BL(W) for writing operation, respectively.

As shown in FIG. 2, the semiconductor memory device according to the present disclosure is a memory device with 1T configuration, in which an interfacial layer of the oxide heterojunction transistor is used for storing data, instead of a capacitor. The oxide heterojunction transistor functions both as a storage element and as a control element, which leads to a simple configuration of the memory device.

In reading operation, a constant current is applied to the source electrode 14 and the drain electrode 15 through the first word line WL (R) and the first bit line BL(R), and a voltage across the source electrode 14 and the drain electrode 15 is measured to indicate whether the interfacial layer is in a high-resistance state or in a low-resistance state, which is representative of logic "0" and logic "1", respectively. In other words, the semiconductor memory device reads stored data by measuring resistance of the interfacial layer 13.

In writing operation, while the first word line WL(R) and the first bit line BL (R) are floated, a bias voltage is applied across the front gate 17 and the back gate 18 through the second word line WL(W) and the second bit line BL(W) to manipulate the resistance state of the interfacial layer. Because the first word line WL(R) and the first bit line BL(R) are floated, the bias voltage is divided by front gate dielectric and the back gate dielectric in a predetermined ratio. The ratio is determined by thicknesses of the front gate dielectric and the back gate dielectric. If the back gate dielectric has a thickness larger than that of the front gate dielectric, the bias voltage will be mainly applied to the back gate dielectric.

Assuming that the front gate 17 is bias to a potential $V_{WL(W)}$ and the back gate 18 is biased to a potential $V_{BL(W)}$, the interfacial layer 13 is changed to a low-resistance state when $V_{BL(W)} - V_{WL(W)} \geq V_{t1}$, which is representative of logic "1", to a high-resistance state when $V_{BL(W)} - V_{WL(W)} \leq V_{t2}$, which is representative of logic "0", to remain unchanged when $-V_{t2} < V_{BL(W)} - V_{WL(W)} < V_{t1}$. "$V_{t1}$" and "$V_{t2}$" are threshold voltages where two transitions of resistance state occur respectively. In other words, the semiconductor memory device writes data to be stored by voltage modulation of the resistance state of the interfacial layer 13.

Figure 3:
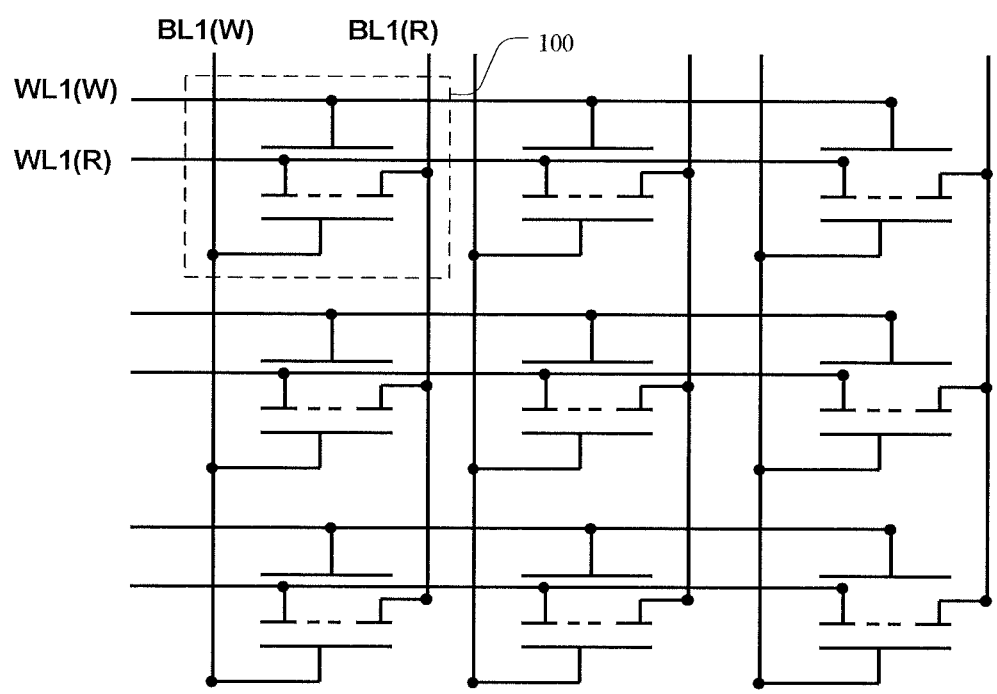
FIG. 3 shows a memory array according to an embodiment of the present disclosure.

FIG. 3 shows a memory array according to an embodiment of the present disclosure, in which each memory cell comprises a semiconductor memory device as shown in FIG. 2. The memory array in FIG. 3 includes 9 memory cells arranged in 3 rows×3 columns. The top left one memory cell 100 is indicated by a block with broken line.

Each memory cell is connected with the first word line WL(R) and the first bit line BL(R) for reading operation, and to the second word line WL(W) and the second bit line BL(W) for writing operation. Thus, the particular one of the memory cells in the memory array can be addressed for reading and writing operations.

Various embodiments of the present disclosure have been described above. It should be understood that they have been presented by way of example, and not limitation on the protection scope of the present disclosure. The protection scope is defined by the attached claims and their equivalences. One skilled person will readily recognize that various modifications and changes may be made to the present disclosure, without departing from the true scope of the present disclosure.

We claim:

1. A semiconductor memory device, comprising a four-terminal oxide heterojunction transistor in 1T configuration in which the oxide heterojunction transistor functions both as a storage element and as a control element and which comprises:
   an oxygen-contained compound substrate;
   an oxygen-contained compound film on the oxygen-contained compound substrate, wherein an interfacial layer between the oxygen-contained compound substrate and the oxygen-contained compound film behaves like two-dimensional electron gas;
   a source electrode and a drain electrode being located on the oxygen-contained compound film and electrically connected with the interfacial layer;
   a front gate on the oxygen-contained compound film; and
   a back gate on a lower surface of the oxygen-contained compound substrate,
   wherein the source electrode and the drain electrode of the oxide heterojunction transistor are respectively connected with a first word line and a first bit line for reading operation, and wherein the front gate and the back gate are respectively connected with a second word line and a second bit line for writing operation, and
   wherein the semiconductor memory device is a memory cell in an array of memory cells, the array comprising a plurality of bit lines arranged orthogonally to a plurality of word lines, wherein each memory cell is directly connected to two of the plurality of word lines and to two of the plurality of bit lines, and each memory cell comprises only the four-terminal oxide heterojunction transistor.

2. The semiconductor memory device according to claim 1, wherein the oxygen-contained compound substrate is made of at least one selected from a group consisting of lanthanum aluminate, strontium titanate, potassium tantalate, lithium tantalate, lithium niobate, lead titanate, lead zirconate, barium titanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

3. The semiconductor memory device according to claim 1, wherein the oxygen-contained compound substrate is doped or undoped.

4. The semiconductor memory device according to claim 1, wherein the oxygen-contained compound substrate is a single-crystal substrate.

5. The semiconductor memory device according to claim 1, wherein the oxygen-contained compound film is made of at least one selected from a group consisting of lanthanum aluminate, strontium titanate, potassium tantalate, lithium tantalate, lithium niobate, lead titanate, lead zirconate, barium titanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

6. The semiconductor memory device according to claim 1, wherein the oxygen-contained compound film is doped or undoped.

7. The semiconductor memory device according to claim 1, wherein the oxygen-contained compound film is an epitaxial layer.

8. The semiconductor memory device according to claim 1, further comprising a protection layer on the oxygen-contained compound film.

9. A method for accessing the semiconductor memory device according to claim 1, comprising:
   in reading operation, a constant current is applied to the source electrode and the drain electrode through the first word line and the first bit line, and a voltage across the source electrode and the drain electrode is measured to indicate a resistance state of the interfacial layer; and
   in writing operation, while the first word line and the first bit line are floated, a bias voltage is applied across the front gate and the back gate through the second word line and the second bit line to manipulate the resistance state of the interfacial layer.

10. The method according to claim 9, wherein in writing operation, logic "1" is written into the semiconductor memory device when the bias voltage is negative and has an absolute value larger than a first threshold voltage Vt1, and logic "0" is written into the semiconductor memory device when the bias voltage is positive and has an absolute value larger than a second threshold voltage Vt2.

11. A semiconductor memory device, comprising a four-terminal oxide heterojunction transistor in 1T configuration in which the oxide heterojunction transistor functions both as a storage element and as a control element, which comprises:
   a semiconductor substrate;
   a back gate being buried in the semiconductor substrate;
   oxygen-contained compound base layer on the back gate;
   an oxygen-contained compound film on the oxygen-contained compound base layer, wherein an interfacial layer between the oxygen-contained compound base layer and the oxygen-contained compound film behaves like. two-dimensional electron gas;
   a source electrode and a drain electrode being located on the oxygen-contained compound film and electrically connected with the interfacial layer; and
   a front gate on the oxygen-contained compound film,
   wherein the source electrode and the drain electrode of the oxide heterojunction transistor are respectively connected with a first word line and a first bit line for reading operation, and
   wherein the front gate and the back gate are respectively connected with a second word line and a second bit line for writing operation, and
   wherein the semiconductor memory device is a memory cell in an array of memory cells, the array comprising a plurality of bit lines arrange orthogonally to a plurality of word lines, wherein each memory cell is directly connected to two of the plurality of word lines and to two of the plurality of bit lines, and each memory cell comprises only the four-terminal oxide heterojunction transistor.

12. The semiconductor memory device according to claim 11, wherein the oxygen-contained compound base layer is made of at least one selected from a group consisting of lanthanum aluminate, strontium titanate, potassium tantalate, lithium tantalate, lithium niobate, lead titanate, lead zirconate, barium titanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

13. The semiconductor memory device according to claim 11, wherein the oxygen-contained compound base layer is doped or undoped.

14. The semiconductor memory device according to claim 11, wherein the oxygen-contained compound base layer is an epitaxial layer.

15. The semiconductor memory device according to claim 11, wherein the oxygen-contained compound film is made of at least one selected from a group consisting of lanthanum aluminate, strontium titanate, potassium tantalate, lithium tantalate, lithium niobate, lead titanate, lead zirconate, barium titanate, lanthanum vanadate, calcium hafnate, gadolinium scandate, dysprosium scandate, strontium zirconate, magnesium oxide, aluminium oxide, silicon dioxide, zinc oxide, tantalum oxide, hafnium oxide, lanthanum oxide, nickel oxide, niobium oxide, tungsten oxide, copper oxide, titanium oxide, and zirconium oxide.

16. The semiconductor memory device according to claim 11, wherein the oxygen-contained compound film is doped or undoped.

17. The semiconductor memory device according to claim 11, wherein the oxygen-contained compound film is an epitaxial layer.

18. The semiconductor memory device according to claim 11, further comprising a protection layer on the oxygen-contained compound film.

19. A method for accessing the semiconductor memory device according to claim 11, comprising:
   in reading operation, a constant current is applied to the source electrode and the drain electrode through the first word line and the first bit line, and a voltage across the source electrode and the drain electrode is measured to indicate a resistance state of the interfacial layer; and
   in writing operation, while the first word line and the first bit line are floated, a bias voltage is applied across the front gate and the back gate through the second word line and the second bit line to manipulate the resistance state of the interfacial layer.

20. The method according to claim 19, wherein in writing operation, logic "1" is written into the semiconductor memory device when the bias voltage is negative and has an absolute value lamer than a first threshold voltage Vt1, and logic "0" is written into the semiconductor memory device when the bias voltage is positive and has an absolute value larger than a second threshold voltage Vt2.

* * * * *